US011293961B2

(12) United States Patent
Kurachi et al.

(10) Patent No.: US 11,293,961 B2
(45) Date of Patent: Apr. 5, 2022

(54) CAPACITANCE DETECTION DEVICE

(71) Applicant: AISIN CORPORATION, Aichi (JP)

(72) Inventors: Hideya Kurachi, Kariya (JP); Akira Takahashi, Kariya (JP)

(73) Assignee: AISIN CORPORATION, Aichi (JP)

( * ) Notice: Subject to any disclaimer, the term of this patent is extended or adjusted under 35 U.S.C. 154(b) by 0 days.

(21) Appl. No.: 16/815,288

(22) Filed: Mar. 11, 2020

(65) Prior Publication Data

US 2020/0292600 A1    Sep. 17, 2020

(30) Foreign Application Priority Data

Mar. 13, 2019 (JP) .............................. JP2019-046087
Jul. 30, 2019 (JP) .............................. JP2019-139352

(51) Int. Cl.
*G01R 27/26* (2006.01)
*H03K 17/955* (2006.01)

(52) U.S. Cl.
CPC ....... *G01R 27/2605* (2013.01); *H03K 17/955* (2013.01)

(58) Field of Classification Search
CPC ................................................ G01R 27/2605
See application file for complete search history.

(56) References Cited

U.S. PATENT DOCUMENTS

| 7,015,705 | B2 | 3/2006 | Inaba et al. |
| 7,098,675 | B2 | 8/2006 | Inaba et al. |
| 2010/0219845 | A1* | 9/2010 | Easter ................ H03K 17/9622 324/678 |
| 2010/0244859 | A1* | 9/2010 | Cormier, Jr. .......... G06F 3/0446 324/678 |
| 2014/0327800 | A1* | 11/2014 | Sugawa ................ H03M 1/124 348/302 |

FOREIGN PATENT DOCUMENTS

| JP | 4310695 B2 | 8/2009 |
| JP | 4356003 B2 | 11/2009 |

OTHER PUBLICATIONS

U.S. Appl. No. 16/815,321, filed Mar. 11, 2020, Hideya Kurachi.
U.S. Appl. No. 16/815,288, filed Mar. 11, 2020, Hideya Kurachi, et al.
Extended European Search Report dated Aug. 4, 2020 in corresponding European Patent Application No. 20163105.8, citing document AA therein, 9 pages.

\* cited by examiner

*Primary Examiner* — Noam Reisner
(74) *Attorney, Agent, or Firm* — Oblon, McClelland, Maier & Neustadt, L.L.P.

(57) ABSTRACT

A capacitance detection device includes: a variable capacitance capacitor; an electrode constituting a detection target whose capacitance is to be detected; and a control circuit, in which the control circuit executes: manipulation processing of manipulating a capacitance of the variable capacitance capacitor to control an intermediate potential, which is a potential at a connection point between the variable capacitance capacitor and the electrode, to a reference potential, when a voltage of a voltage application device is applied to the electrode via the variable capacitance capacitor; and detection processing of detecting the capacitance of the detection target, based on the capacitance of the variable capacitance capacitor when being controlled to the reference potential.

9 Claims, 8 Drawing Sheets

CAPACITANCE DETECTION DEVICE

CROSS REFERENCE TO RELATED APPLICATIONS

This application is based on and claims priority under 35 U.S.C. § 119 to Japanese Patent Applications 2019-46087 and 2019-139352, filed on Mar. 13, 2019 and Jul. 30, 2019 respectively, the entire contents of which are incorporated herein by reference.

TECHNICAL FIELD

This disclosure relates to a capacitance detection device.

BACKGROUND DISCUSSION

In the related art, for example, a device disclosed in Japanese Patent No. 4356003 (Reference 1) has been known as a capacitance detection device. The capacitance detection device includes: a reference capacitor; a detection capacitor (capacitor to be measured) connected to the reference capacitor; a first switch that initializes the reference capacitor; a second switch disposed between the reference capacitor and the detection capacitor; a third switch that initializes the detection capacitor; and a control circuit. After initializing the reference capacitor by manipulating the first switch, the control circuit performs a switch manipulation including the manipulation of the second switch and the manipulation of the third switch a plurality of times, acquires an intermediate potential that is a potential between the reference capacitor and the detection capacitor, and derives the number of times of detection corresponding to the number of times of the switch manipulation when the intermediate potential is lower than a reference potential. This number of times of the detection is hereinafter referred to as a count value. This count value is correlated with the capacitance of the detection capacitor, and the capacitance of the detection capacitor is detected by deriving the count value.

By the way, in Reference 1, the capacitance of the detection capacitor is detected by deriving the count value. Therefore, since the capacitance of one count becomes a detection resolution, it is necessary to increase the number of times of switch manipulations in order to improve detection accuracy. For example, the number of times of switch manipulations may be on the order of tens of thousands. Accordingly, a time required for detecting the capacitance increases.

On the other hand, if the time required for detecting the capacitance increases, influence of low-frequency noise superimposed on a power supply (first and second potential sources) related to the detection of the capacitance and an increase in the fluctuation width of the power supply itself becomes remarkable, and conversely, the detection accuracy may be reduced. That is, increasing the number of times of the switch manipulations in order to improve the detection accuracy may conversely cause a reduction in the detection accuracy.

Thus, a need exists for a capacitance detection device which is not susceptible to the drawback mentioned above.

SUMMARY

Hereinafter, means for solving the problems and the effects thereof will be described.

A first aspect is directed to a capacitance detection device including: a variable capacitance capacitor; an electrode constituting a detection target whose capacitance is to be detected; and a control circuit, in which the control circuit executes: manipulation processing of manipulating a capacitance of the variable capacitance capacitor to control an intermediate potential, which is a potential at a connection point between the variable capacitance capacitor and the electrode, to a reference potential, when a voltage of a voltage application device is applied to the electrode via the variable capacitance capacitor; and detection processing of detecting the capacitance of the detection target, based on the capacitance of the variable capacitance capacitor when being controlled to the reference potential.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

First Embodiment

Figure 1:
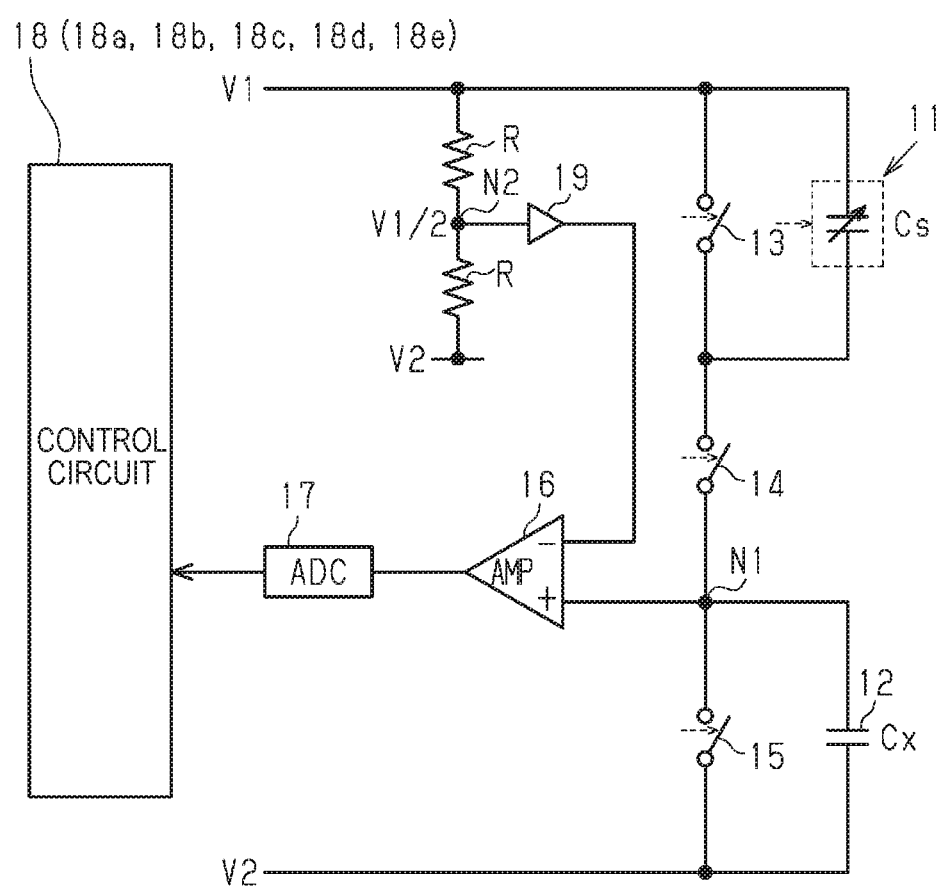
FIG. 1 is a circuit diagram illustrating an electrical configuration of a capacitance detection device according to a first embodiment.

Hereinafter, a first embodiment of a capacitance detection device will be described. As illustrated in FIG. 1, the capacitance detection device includes a capacitor array 11, a detection capacitor 12, the capacitance of which is to be detected, a first switch 13, a second switch 14, a third switch 15, a differential amplifier circuit 16 as an amplification unit, an AD conversion circuit 17 as an AD conversion unit, and a control circuit 18.

Figure 2:
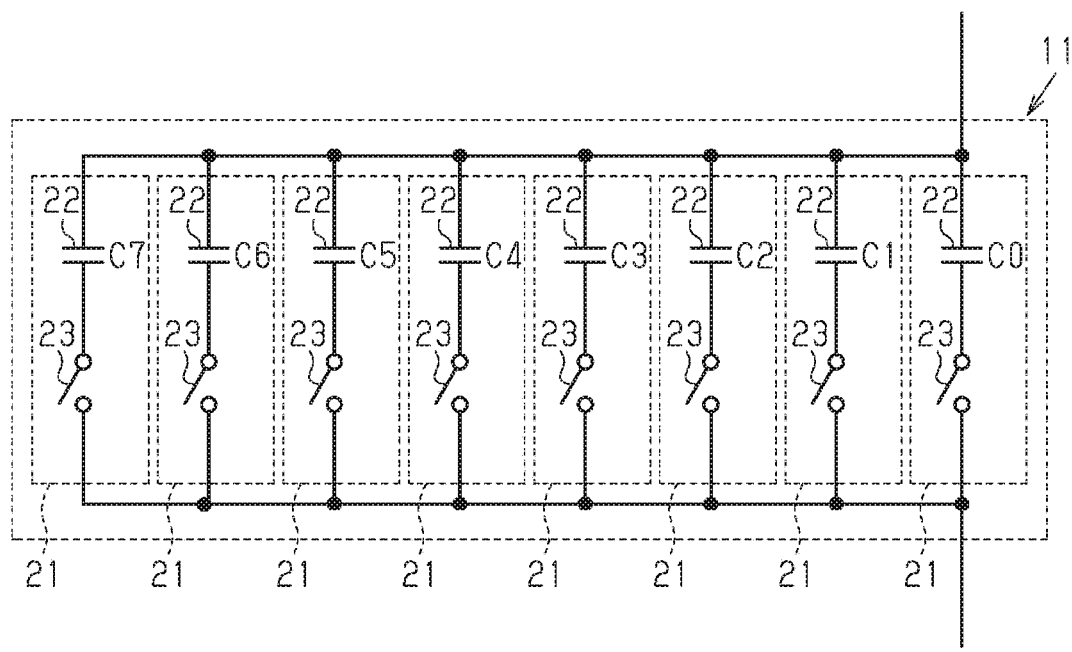
FIG. 2 is a circuit diagram illustrating a capacitor array of the capacitance detection device according to the same embodiment.

The capacitor array 11 has a variable combined capacitance Cs. That is, as illustrated in FIG. 2, the capacitor array 11 is configured as a plurality of (for example, eight) capacitance units 21, each having a capacitor 22 and a switch 23 connected in series to each other, are connected in parallel to each other. The capacitances of a plurality of the capacitors 22 are set to be different from each other. In detail, when the capacitance of the capacitor 22 having the minimum capacitance is represented by C0, the capacitances C0, C1, C2, C3, C4, C5, C6, and C7 of all the capacitors 22 are set to satisfy Equation (1).

$$Cn = C0 \times 2^n, n=0 \text{ to } 7 \tag{1}$$

Further, the switch 23 connected to the capacitor 22 having the capacitance Cn is switched between an ON state and an OFF state (state in which the device does not function as a capacitor without a potential difference between electrodes) according to a control value bn (n=0 to 7) of the capacitor array 11 set by the control circuit 18. That is, the switch 23 is turned on when the control value bn is "1", and is turned off when the control value bn is "0".

Therefore, the combined capacitance Cs of the capacitor array 11 is represented by Equation (2) according to the control value bn (n=0 to 7).

$$Cs = b0 \cdot C0 + b1 \cdot C1 + \ldots b7 \cdot C7 \tag{2}$$

That is, the combined capacitance Cs changes according to the control value bn ("1" or "0") with the capacitance C0 as the minimum unit (LSB).

The capacitor array 11 is arranged so that the capacitances C0 to C7 of the respective capacitors 22 do not fluctuate, for example, even when the surrounding environment changes.

As illustrated in FIG. 1, the detection capacitor 12 has a capacitance (hereinafter, the capacitance of the detection capacitor 12 is referred to as a "detection capacitance Cx") including a capacitance thereof and a stray capacitance determined by the surrounding environment.

The capacitor array 11 and the detection capacitor 12 are connected in series to a power supply V1. That is, one end of the capacitor array 11 is electrically connected to the high-side potential V1 as a power supply, and the other end thereof is electrically connected to one end of the detection capacitor 12 via the second switch 14. The other end of the detection capacitor 12 is electrically connected to a low-side potential V2 (<V1) as a power supply. The low-side potential V2 is set to, for example, the same potential (=0) as the ground.

The first switch 13 initializes the capacitor array 11 (discharges charges stored in the capacitors). In detail, the first switch 13 is connected between, that is, is connected in parallel to, both terminals of the capacitor array 11 (the plurality of capacitance units 21), and connects and disconnects both terminals of the capacitor array 11 according to switching to the ON state and the OFF state. More strictly, for example, when all the switches 23 of the plurality of capacitance units 21 are in the ON state, the first switch 13 connects/initializes both terminals of all the capacitors 22 of the plurality of capacitance units 21 according to the switching to the ON state (discharges the charges stored in the capacitors). The second switch 14 is electrically connected between the capacitor array 11 and the detection capacitor 12, and connects and disconnects between the capacitor array 11 and the detection capacitor 12 according to switching to the ON state and the OFF state. The third switch 15 initializes the detection capacitor 12 (discharges the charges stored in the capacitors). In detail, the third switch 15 is connected between, that is, is connected in parallel to, both terminals of the detection capacitor 12, and connects and disconnects both terminals of the detection capacitor 12 according to the switching to the ON state and the OFF state.

The differential amplifier circuit 16 has a positive input terminal + connected to a connection point N1 of the capacitor array 11 and the detection capacitor 12. The differential amplifier circuit 16 has a negative input terminal − connected, via an amplifier circuit 19, to a connection point N2 of a pair of resistors R connected in series to the power supply. The differential amplifier circuit 16 receives an intermediate potential Vout, which is a potential at the connection point N1, and a reference potential Vref (=V1/2) obtained by dividing the power supply by the pair of resistors R by two, and amplifies and outputs a differential voltage $\Delta V$ (=Vout−Vref).

The intermediate potential Vout is a potential of capacitive voltage division of the power supply by the combined capacitance Cs of the capacitor array 11 and the detection capacitance Cx of the detection capacitor 12, and is expressed by Equation (3).

$$Vout = V1/(1+Cx/Cs) \tag{3}$$

That is, the intermediate potential Vout is inversely proportional to a ratio (=Cx/Cs) of the detection capacitance Cx to the combined capacitance Cs.

The differential voltage $\Delta V$ is expressed by Equation (4).

$$\Delta V = Vout - Vref = V1/(1+Cx/Cs) - V1/2 \tag{4}$$

Therefore, when the combined capacitance Cs coincides with the detection capacitance Cx (Cx/Cs=1), the intermediate potential Vout coincides with the reference potential Vref, and the differential voltage $\Delta V$ thus becomes zero.

The polarity of the differential voltage $\Delta V$ becomes negative when the detection capacitance Cx is larger than the combined capacitance Cs, and becomes positive when the detection capacitance Cx is smaller than the combined capacitance Cs. Therefore, the differential amplifier circuit 16 functions as a comparator that determines a magnitude relationship between the combined capacitance Cs and the detection capacitance Cx when changing the combined capacitance Cs of the capacitor array 11 according to the control value bn (n=0 to 7).

The AD conversion circuit 17 has, for example, a 10-bit code, performs AD conversion on the differential voltage $\Delta V$ amplified by the differential amplifier circuit 16, and outputs the converted result to the control circuit 18. As is apparent from Equation (4), when a deviation between the combined capacitance Cs and the detection capacitance Cx is small (Cx/Cs≈1), the differential voltage $\Delta V$ is close to zero, but when the deviation between the combined capacitance Cs and the detection capacitance Cx is large, the differential voltage $\Delta V$ is a positive or negative number having a large absolute value.

Thus, it is preferable that when the minimum unit (LSB) of the AD conversion of the AD conversion circuit 17 is constant, the differential amplifier circuit 16 is configured to be able to change an amplification factor in accordance with the absolute value of the differential voltage $\Delta V$. In this case, when the absolute value of the differential voltage $\Delta V$ exceeds a predetermined value, such as when the combined capacitance Cs of the capacitor array 11 is changed according to the control value bn (n=0 to 7), the differential amplifier circuit 16 amplifies the differential voltage $\Delta V$ at a relatively small amplification factor. On the other hand, when the absolute value of the differential voltage $\Delta V$ is lower than the predetermined value, the differential amplifier circuit 16 amplifies the differential voltage $\Delta V$ at a relatively large amplification factor. As a result, the AD conversion circuit 17 can perform the AD conversion in the minimum unit substantially changed according to the absolute value of the differential voltage ΔV.

Alternatively, for example, when the absolute value of the differential voltage ΔV exceeds a predetermined value, such as when the combined capacitance Cs of the capacitor array 11 is changed according to the control value bn (n=0 to 7), the AD conversion circuit 17 may output a constant digital value indicating that the absolute value of the differential voltage ΔV exceeds the predetermined value. When the absolute value of the differential voltage ΔV is smaller than the predetermined value, the AD conversion circuit 17 may output a digital value indicating the differential voltage ΔV.

Alternatively, the AD conversion circuit 17 may be constituted by a plurality of units or a plurality of channels such that the minimum unit (LSB) of the AD conversion can be changed in accordance with the absolute value of the differential voltage ΔV. In this case, for example, when the absolute value of the differential voltage ΔV exceeds the predetermined value, such as when the combined capacitance Cs of the capacitor array 11 is changed according to the control value bn (n=0 to 7), the AD conversion circuit 17 outputs a digital value obtained by the AD conversion in a relatively large set minimum unit. On the other hand, when the absolute value of the differential voltage ΔV is lower than the predetermined value, the AD conversion circuit 17 outputs a digital value obtained by the AD conversion in a relatively small minimum unit.

In any case, when the absolute value of the differential voltage ΔV is lower than the predetermined value, that is, when the intermediate potential Vout is close to the reference potential Vref, the AD conversion circuit 17 only needs to perform the AD conversion in a minimum unit smaller than a voltage change of the intermediate potential Vout due to a change corresponding to the resolution of the combined capacitance Cs.

The control circuit 18 is mainly configured with, for example, an MCU (microcomputer), and controls driving of the first switch 13, the second switch 14, and the third switch 15 to generate the intermediate potential Vout which is a potential of the capacitive voltage division of the power supply by the combined capacitance Cs and the detection capacitance Cx. In detail, the control circuit 18 performs the following processing A.

1. The first switch 13 and the third switch 15 are both turned on, the second switch 14 is turned off, and the charges are discharged by short-circuiting between the terminals of each of the capacitor array 11 and the detection capacitor 12. That is, each of the capacitor array 11 and the detection capacitor 12 is initialized.

2. The first switch 13 and the third switch 15 are both turned off, the second switch 14 is turned on, and the capacitor array 11 and the detection capacitor 12 are connected in series to each other. Then, the intermediate potential Vout is generated at the connection point N1.

3. The differential voltage ΔV (=Vout−V1/2) amplified by the differential amplifier circuit 16 and AD-converted by the AD conversion circuit 17 is input, so that the differential voltage ΔV is detected. That is, the control circuit 18 as a detection unit 18a detects the differential voltage ΔV correlated with the intermediate potential Vout.

Further, the control circuit 18 as a switching control unit 18b sets the control value bn (n=0 to 7), and controls driving of the plurality of switches 23 to selectively switch the plurality of capacitors 22 of the capacitor array 11 between the ON state and the OFF state according to the control values bn (n=0 to 7). At this time, as described above, the combined capacitance Cs of the capacitor array 11 changes according to the control values bn (n=0 to 7). Then, when changing the combined capacitance Cs of the capacitor array 11 according to the control values bn (n=0 to 7), the control circuit 18 stores, in a built-in memory thereof, the control value bn determined based on the polarity of the differential voltage ΔV AD-converted by the AD conversion circuit 17.

That is, the control circuit 18 uses a so-called binary search technique to acquire the combined capacitance Cs that is close to the detection capacitance Cx of the detection capacitor 12. In detail, the control circuit 18 performs the following processing B.

1. The control value b7, which is the uppermost bit of the control value bn of the capacitor array 11, is set to "1", and the control values b6 to b0, which are the other lower bits, are set to "0". That is, the set value is set to "1000_0000".

2. The differential voltage ΔV (=Vout−V1/2) is input and the like according to the processing A described above.

3. The control value b7 is determined to be "1" or "0" according to the polarity of the differential voltage ΔV. Then, a determined value a of the control value b7 is stored in the built-in memory. That is, when the polarity of the differential voltage ΔV is negative, the determined value a of the control value b7 is set to "1" since the combined capacitance Cs (=C7) is smaller than the detection capacitance Cx. On the other hand, when the polarity of the differential voltage ΔV is positive, the determined value a of the control value b7 is set to "0" since the combined capacitance Cs (=C7) is larger than the detection capacitance Cx.

4. Similarly, the control value b6 as a next bit is set to "1", and the control values b5 to b0 as the other lower bits are set to "0". That is, the set value is set to "a100_0000".

5. The differential voltage ΔV (=Vout−V1/2) is input and the like according to the processing A described above.

6. The control value b6 is determined to be "1" or "0" according to the polarity of the differential voltage ΔV. Then, a determined value b of the control value b6 is stored in the built-in memory.

7. The processing of 4 to 6 are similarly repeated to determine the control values b5 to b0, which are next bits, as "1" or "0", and determined values c to h are stored in the built-in memory.

As described above, the control circuit 18 acquires the combined capacitance Cs (hereinafter, also referred to as a "first combined capacitance Cs1") represented by the set value "abcd_efgh".

$$Cs1 = a \cdot C7 + b \cdot C6 + \ldots + h \cdot C0 \qquad (5)$$

The first combined capacitance Cs1 is a combined capacitance Cs that is closest to the detection capacitance Cx and is smaller than the detection capacitance Cx. Similarly, the control circuit 18 acquires the combined capacitance Cs (hereinafter, also referred to as a "second combined capacitance Cs2"), which is closest to the detection capacitance Cx and is larger than the detection capacitance Cx, by adding the minimum capacitance C0 to the first combined capacitance Cs1.

$$Cs2 = Cs1 + C0 \qquad (6)$$

That is, the control circuit 18 as an acquisition unit 18c acquires, as the first combined capacitance Cs1 and the second combined capacitance Cs2, the two adjacent combined capacitances Cs in which a magnitude relationship between the intermediate potential Vout and the predetermined reference potential Vref (=V1/2) is inverted.

Further, the control circuit 18 as the detection unit 18a causes the control values b7 to b0 to coincide with the set value "abcd_efgh" to cause the combined capacitance Cs of the capacitor array 11 to coincide with the first combined capacitance Cs1, and detects the differential voltage ΔV (hereinafter, referred to as a "first differential voltage ΔV1") correlated with the intermediate potential Vout (hereinafter, a "first intermediate potential Vout1") when following the above-described processing A. Similarly, the control circuit 18 as the detection unit 18a causes the control values b7 to b0 to coincide with the set value "abcd_effgh+0000_0001" to cause the combined capacitance Cs of the capacitor array 11 to coincide with the second combined capacitance Cs2, and detects the differential voltage ΔV (hereinafter, referred to as a "second differential voltage ΔV2) correlated with the intermediate potential Vout (hereinafter, also referred to as "second intermediate potential Vout2") when following the above-described processing A.

Then, the control circuit 18 as a calculation unit 18d calculates an estimated combined capacitance Cse of the capacitor array 11 when the intermediate potential Vout coincides with the reference potential Vref, based on the first differential voltage ΔV1 and the second differential voltage ΔV2.

Figure 3:
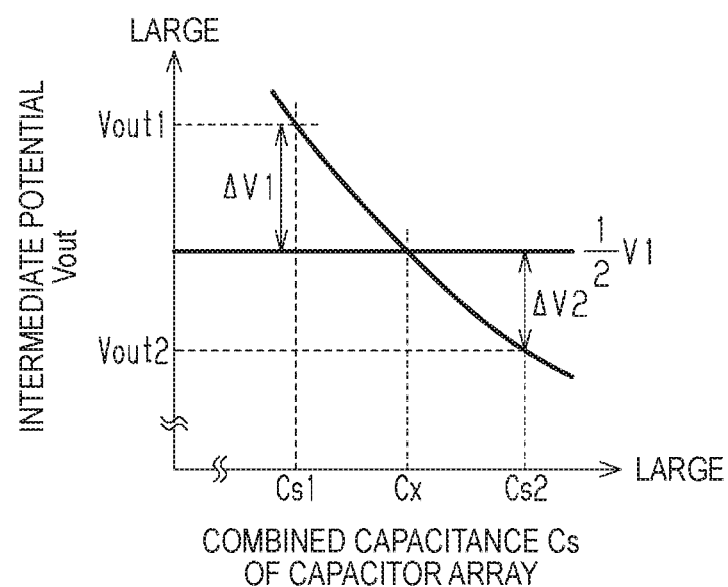
FIG. 3 is a graph illustrating a calculation mode of an estimated combined capacitance in the capacitance detection device according to the embodiment.

That is, as illustrated in FIG. 3, when the intermediate potential Vout is approximated to be proportional to the combined capacitance Cs between the first combined capacitance Cs1 and the second combined capacitance Cs2, a slope between the first combined capacitance Cs1 and the estimated combined capacitance Cse coincides with a slope between the estimated combined capacitance Cse and the second combined capacitance Cs2, so that Equation (7) is established.

$$\Delta V1/(Cse-Cs1)=\Delta V2/(Cse2-Cse) Cse=(\Delta V1 \cdot Cs2+ \Delta V2 \cdot Cs1)/(\Delta V1+\Delta V2) \quad (7)$$

The estimated combined capacitance Cse of the capacitor array 11 in which the intermediate potential Vout coincides with the reference potential Vref coincides with the capacitance of the detection capacitor 12 as described above. The control circuit 18 as a derivation unit 18e derives the estimated combined capacitance Cse at this time as the detection capacitance Cx of the detection capacitor 12.

As is apparent from Equation (7), since the estimated combined capacitance Cse is calculated based on the differential voltage ΔV, the calculation is not hindered even when the intermediate potential Vout itself is not detected. Further, the differential voltage ΔV is treated as a dimensionless number since the differential voltage ΔV exists in both the numerator and the denominator. Therefore, even when the differential voltage ΔV is amplified by the differential amplifier circuit 16 at a predetermined amplification factor or is AD-converted by the AD conversion circuit 17, the calculation result of the estimated combined capacitance Cse is basically unchanged. As described above, when the intermediate potential Vout is close to the reference potential Vref, the digital value of the differential voltage ΔV is expressed by a minimum unit smaller than the voltage change of the intermediate potential Vout due to a change corresponding to the resolution of the combined capacitance Cs. Thus, the detection capacitance Cx is derived with higher accuracy than the resolution of the combined capacitance Cs.

Figure 4:
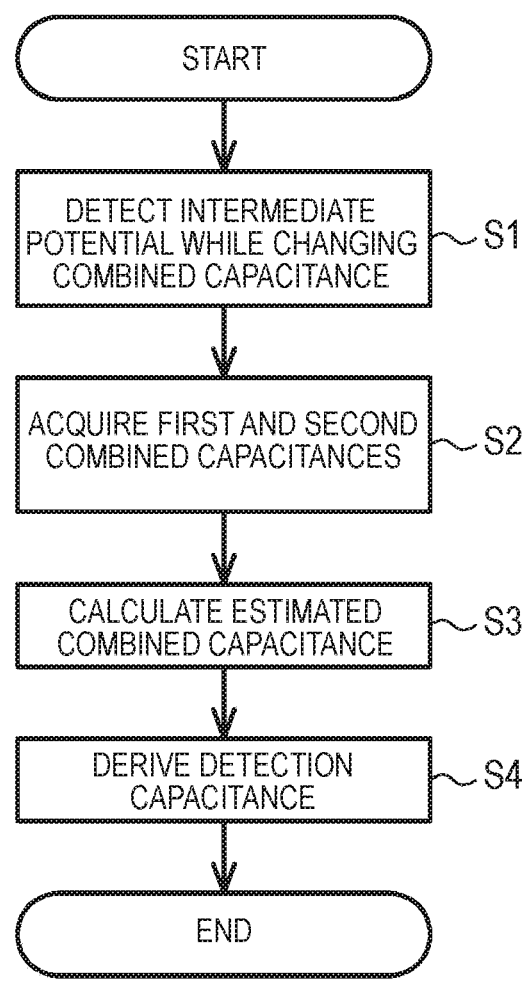
FIG. 4 is a flowchart illustrating a derivation mode of a detection capacitance in the capacitance detection device according to the embodiment.

Next, a deviation mode in which the control circuit 18 derives the detection capacitance Cx will be generally described. This processing is repeatedly executed by, for example, a periodic interruption. As illustrated in FIG. 4, when the processing is shifted to this routine, in step S1, the control circuit 18 changes the combined capacitance Cs of the capacitor array 11 by the above-described processing A and B while detecting the intermediate potential Vout accordingly changed, more specifically, the differential voltage ΔV.

Subsequently, in step S2, the control circuit 18 acquires, as the first combined capacitance Cs1 and the second combined capacitance Cs2, one of the combined capacitances Cs in the vicinity in which a magnitude relationship between the intermediate potential Vout and the reference potential Vref is inverted.

Next, in step S3, the control circuit 18 calculates the first intermediate potential Vout1 and the second intermediate potential Vout2 as the intermediate potential Vout when the combined capacitance Cs is the first combined capacitance Cs1 and the second combined capacitance Cs2, respectively. More specifically, the control circuit 18 calculates, based on the first differential voltage ΔV1 and the second differential voltage ΔV2, the estimated combined capacitance Cse of the capacitor array 11 when the intermediate potential Vout coincides with the reference potential Vref.

Then, in step S4, the control circuit 18 derives the capacitance of the detection capacitor 12 as the detection capacitance Cx, based on the estimated combined capacitance Cse, and ends the processing. That is, the control circuit 18 causes the detection capacitance Cx to coincide with the estimated combined capacitance Cse.

The operation and effect of the present embodiment will be described. (1) In the present embodiment, the acquisition unit 18c acquires the first combined capacitance Cs1 and the second combined capacitance Cs2 closest to the capacitance of the capacitor array 11 when the intermediate potential Vout coincides with the reference potential Vref. Then, the calculation unit 18d calculates the estimated combined capacitance Cse based on the first intermediate potential Vout1 and the second intermediate potential Vout2. Then, the derivation unit 18e derives the detection capacitance Cx based on the fact that the intermediate potential Vout, which is the potential of the capacitive voltage division of the power supply by the estimated combined capacitance Cse and the capacitance of the detection capacitor 12, coincides with the reference potential Vref.

The combined capacitance Cs can be quickly converged to the first combined capacitance Cs1 and the second combined capacitance Cs2 by selectively switching the plurality of capacitors 22 between the ON state and the OFF state by the switching control unit 18b, that is, by changing the capacitance and comparing the potential by the binary search. For example, the number of times by which the eight capacitors 22 are selectively switched to the ON state and the OFF state is on the order of ten and several times. Therefore, a time required for detecting the capacitance of the detection capacitor 12 can be further shortened. In addition, the detection capacitance Cx is derived such that the intermediate potential Vout, which is the potential of the capacitive voltage division of the power supply with the estimated combined capacitance Cse, coincides with the reference potential Vref. Thus, the resolution of the capacitance of the capacitor array 11, that is, the capacitance of the detection capacitor 12, can be detected with higher accuracy than the capacitance C0.

(2) In the present embodiment, since the detection unit 18a only needs to detect the differential voltage ΔV between the intermediate potential Vout and the reference potential Vref, for example, a range required for the detection can be further reduced as compared with the entire range of the intermediate potential Vout, and an expensive and large-scale high-resolution ADC is not required, so that the costs can be reduced. Further, since the estimated combined capacitance Cse can be calculated based on the differential voltage ΔV between the intermediate potential Vout and the reference potential Vref, a load of the calculation can be further reduced.

(3) In the present embodiment, the differential amplifier circuit 16 amplifies the differential voltage ΔV between the intermediate potential Vout and the reference potential Vref, so that even when the differential voltage ΔV is very small, the differential voltage ΔV can be made more prominent, and an SN ratio can be further improved. In particular, when characteristics of the differential amplifier circuit 16 are completely differential, in-phase noise can be cut. Further, when the amplification factor of the differential amplifier circuit 16 is changed according to the absolute value of the differential voltage ΔV, even in the AD conversion circuit 17 in which the minimum unit (LSB) of the AD conversion is constant, the minimum unit can be substantially changed. Therefore, the AD conversion circuit 17 having a simple configuration can be adopted, and the costs can be reduced.

(4) In the present embodiment, the differential voltage ΔV between the intermediate potential Vout and the reference potential Vref is AD-converted by the AD conversion circuit 17, so that the differential voltage ΔV can be handled as the digital value, and smoother calculation processing can be realized.

(5) In the present embodiment, as a time required for detecting the capacitance of the detection capacitor 12 can be further shortened, a circuit stop time can be lengthened accordingly, and current consumption of the entire device can be further reduced. Alternatively, as a time required for detecting the capacitance of the detection capacitor 12 can be further shortened, influence of low-frequency noise superimposed on the power supply (the high-side potential V1 or the like) or an increase in the fluctuation width of the power supply itself can be reduced, and the detection accuracy can be further improved.

(6) In the present embodiment, as the time required for detecting the capacitance of the detection capacitor 12 can be further shortened, for example, the number of times of detections within a certain time can be increased. Therefore, by performing filtering processing such as averaging the capacitance of the detection capacitor 12 detected within the certain time, the capacitance of the detection capacitor 12 can be detected with higher accuracy.

(7) In the present embodiment, since the capacitances Cn (n=0 to 7) of the plurality of capacitors 22 have a power-of-two relationship, the first combined capacitance Cs1 and the second combined capacitance Cs2 can be acquired in a shorter time by the binary search.

Second Embodiment

Hereinafter, a second embodiment will be described with reference to the drawings, focusing on differences from the first embodiment.

Figure 5:
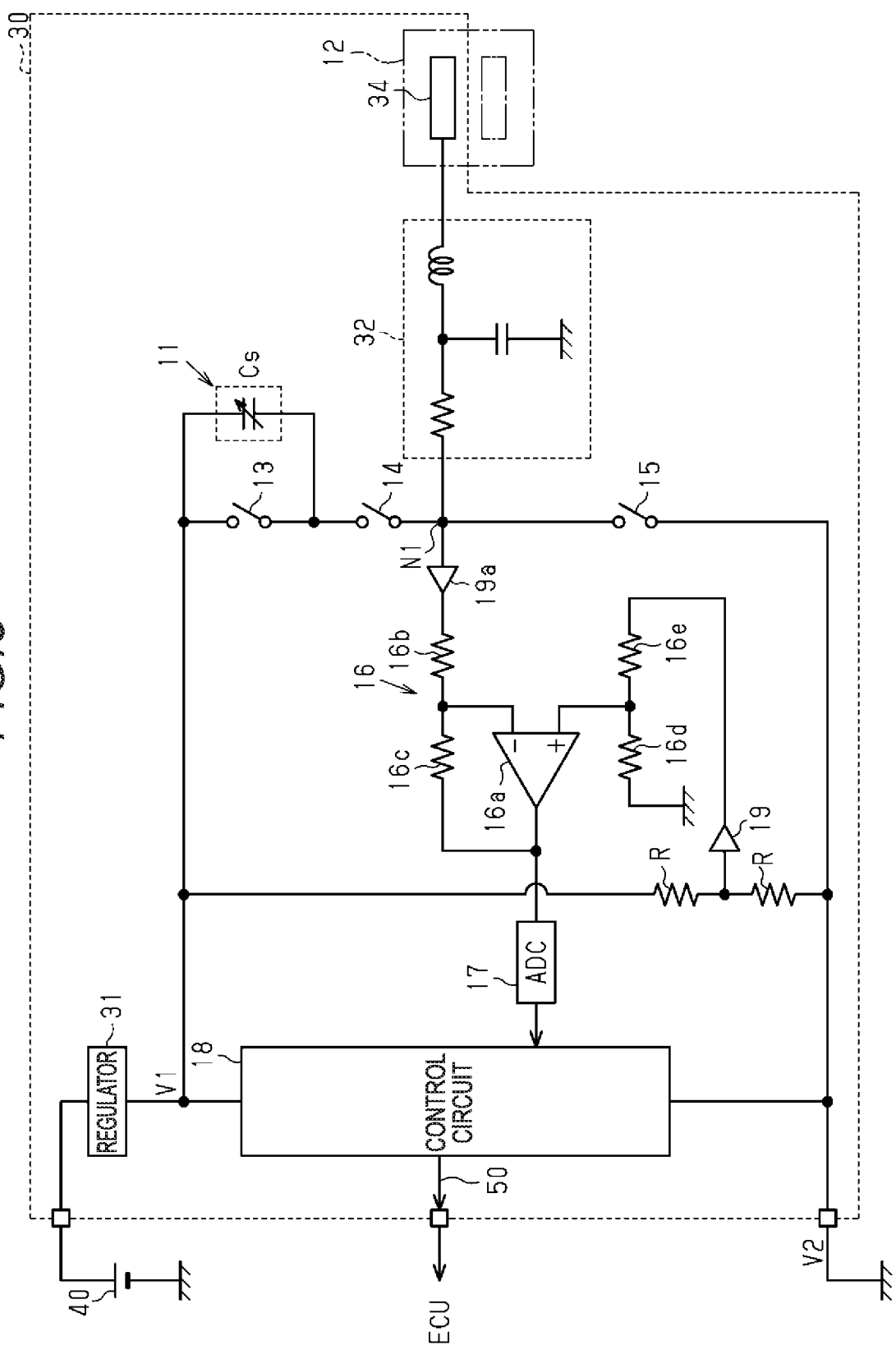
FIG. 5 is a circuit diagram illustrating an electrical configuration of a second embodiment.

FIG. 5 illustrates a capacitance detection device 30 according to the present embodiment. In FIG. 5, members corresponding to the members illustrated in FIG. 1 are denoted by the same reference numerals for convenience. The capacitance detection device 30 according to the present embodiment is a proximity detection sensor that is mounted on a vehicle and detects whether or not a person approaches a predetermined portion of the vehicle. In detail, for example, the capacitance detection device 30 is a sensor that detects whether or not a person's foot touches a rear part of the vehicle or detects whether or not a person's hand traces the vicinity of a slide door of the vehicle. When the proximity detection sensor detects that a predetermined part of a person serving as a target object approaches the vehicle, an electronic control unit (hereinafter, ECU) for controlling opening and closing of an opening and closing part of the vehicle automatically opens the opening and closing part.

As illustrated in FIG. 5, a battery 40 is connected to the capacitance detection device 30, and the voltage of the battery 40 is reduced by a regulator 31 to the high-side potential V1. Further, as illustrated in FIG. 5, an electrode 34 is connected to the connection point N1 via a filter circuit 32. The electrode 34 constitutes the detection capacitor 12 that is a virtual capacitor whose capacitance is to be detected together with a member outside the capacitance detection device 30.

Further, as illustrated in FIG. 5, the differential amplifier circuit 16 includes an operational amplifier 16a, and a negative input terminal − of the operational amplifier 16a is connected to the connection point N1 via a resistor 16b and an amplifier circuit 19a, and is connected to an output terminal via a resistor 16c. Here, the amplifier circuit 19a has the same specification as the amplifier circuit 19. Further, a positive input terminal + of the operational amplifier 16a is grounded via a resistor 16d, and is connected to the amplifier circuit 19 via a resistor 16e.

In the present embodiment, the resistor 16b and the resistor 16e have the same resistance value R1, and the resistor 16c and the resistor 16d have the same resistance value R2. In that case, the output of the differential amplifier circuit 16 is expressed by Equation (8).

$$(R2/R1) \cdot (\text{Vref} - \text{Vout}) \tag{8}$$

In the present embodiment, the resistance values R1 and R2 are set such that (R2/R1) is "Vadin/(8·C0·Rref)." Here, an input voltage range Vadin of the AD conversion circuit 17 and a reference sensitivity ratio Rref are used. The reference sensitivity ratio Rref indicates a ratio of a change amount of the intermediate potential Vout to the same change amount when the detection capacitance Cx slightly changes when the combined capacitance Cs is a standard capacitance value CStyp. That is, when Equation (3) is differentiated by the detection capacitance Cx, Equation (9) is obtained.

$$[-V1/\{1+(Cx/Cs)\}^2] \cdot (1/Cs) \tag{9}$$

Here, a value obtained by substituting the standard capacitance value CStyp into each of the combined capacitance Cs and the detection capacitance Cx is the reference sensitivity ratio Rref. In this case, when the combined capacitance Cs determined by the above-described binary search is equal to the standard capacitance value CStyp, when an output value of the differential amplifier circuit 16 changes by the input voltage range Vadin of the AD conversion circuit 17, the change amount of the detection capacitance Cx is "8·C0".

The control circuit 18 according to the present embodiment is constituted by a dedicated hardware circuit such as an application specific integrated circuit (ASIC). By the way, in the present embodiment, it is assumed that by starting the above-described ECU, the voltage of the battery 40 is reduced by the regulator 31 and is output to the control circuit 18 and the like. Further, the control circuit 18 is connected to the above-mentioned ECU via a communication line 50.

Figure 6:
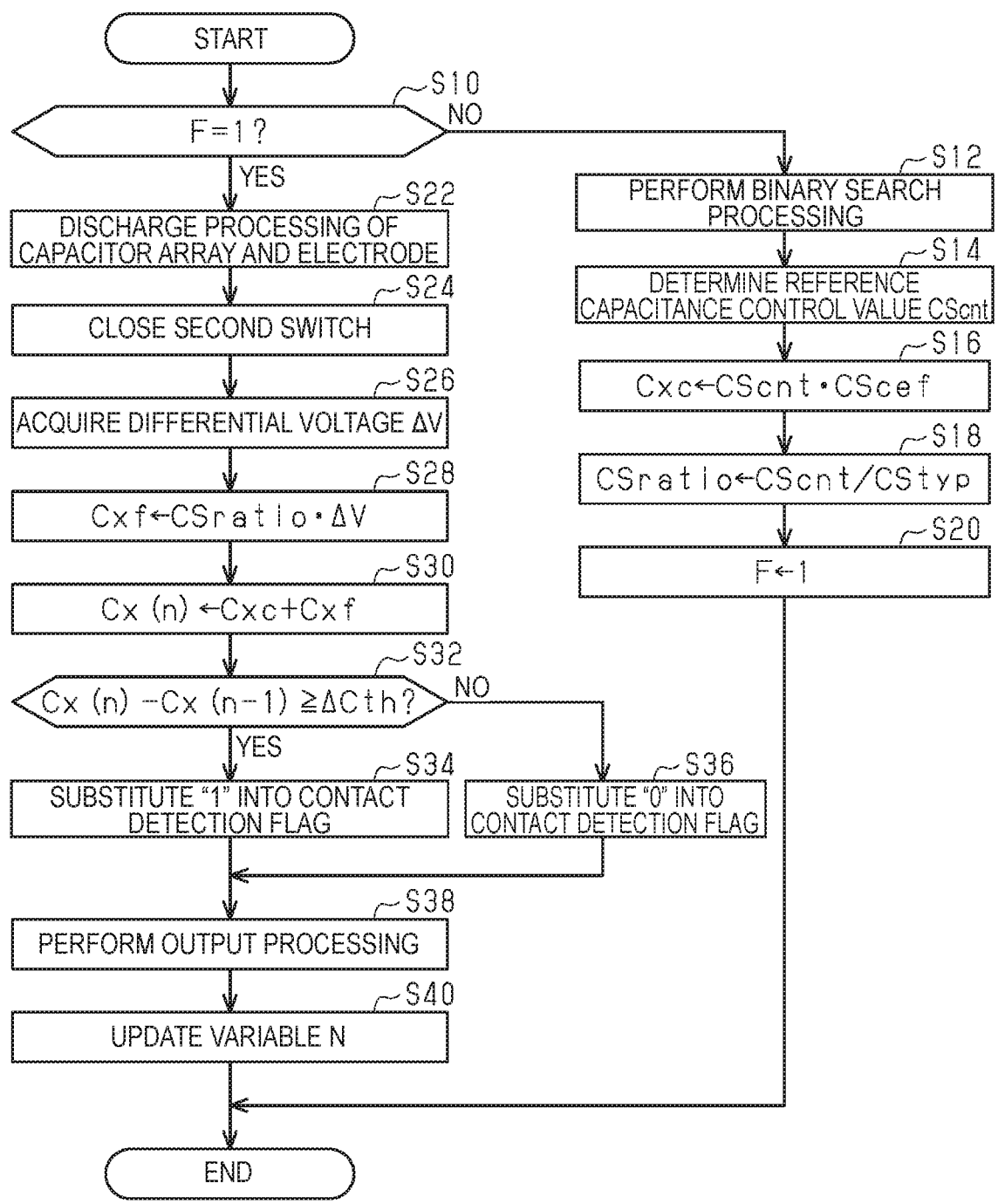
FIG. 6 is a flowchart illustrating a procedure of processing executed by a control circuit according to the embodiment.

FIG. 6 illustrates a procedure of processing executed by the control circuit 18. The processing illustrated in FIG. 6 is repeatedly executed by the control circuit 18 at a predetermined cycle. In the following, the step number of each processing is expressed by a number prefixed with "S".

In the series of processing illustrated in FIG. 6, the control circuit 18 first determines whether or not a confirmation flag F is "1" (S10). The confirmation flag F is set to "1" when the control values b0 to b7 are determined by the binary search and a reference capacitance control value CScnt is determined according to the control values b0 to b7, and is set to "0" otherwise. The confirmation flag F is set to "0" at a time point when the capacitance detection device 30 is started with the start of the ECU. That is, at this time point, the reference capacitance control value CScnt is initialized.

When the confirmation flag F is set to "0" (S10: NO), the control circuit 18 executes binary search processing (S12) and determines the reference capacitance control value CScnt by determining the respective determined values a to h of the control values b0 to b7 (S14). In other words, the intermediate potential Vout is feedback-controlled to the reference potential Vref, and the reference capacitance control value CScnt is determined based on the control values b0 to b7 at a time point when the intermediate potential Vout approaches the reference potential Vref as much as possible. In the reference capacitance control value CScnt, the uppermost bit is a and the lowermost bit is h.

The binary search processing in the present embodiment is basically the same as the processing 1 to 7 described above, but discharge processing is executed before obtaining the respective determined values of the control values b7 to b0 as described below. That is, first, the control circuit 18 turns on both the first switch 13 and the third switch 15 and turns off the second switch 14 to execute discharge processing of the capacitor array 11 and the electrode 34, and turns off both the first switch 13 and the third switch 15 and turns on the second switch 14 to connect the capacitor array 11 and the electrode 34 in series to each other. Then, the control circuit 18 performs feedback control of the intermediate potential Vout to the reference potential Vref using the control value b7 of the uppermost bit as a manipulation amount. Next, after executing the discharge processing again, the control circuit 18 performs feedback control of the intermediate potential Vout to the reference potential Vref using the control value b6 as the manipulation amount in a state in which the capacitor array 11 and the electrode 34 are connected in series to each other. Thereafter, the discharge processing and the processing of connecting the capacitor array 11 and the electrode 34 in series to each other are repeated whenever the manipulation amount is changed until the intermediate potential Vout is feedback-controlled to the reference potential Vref using the control value b0 as the manipulation amount.

Figure 7:
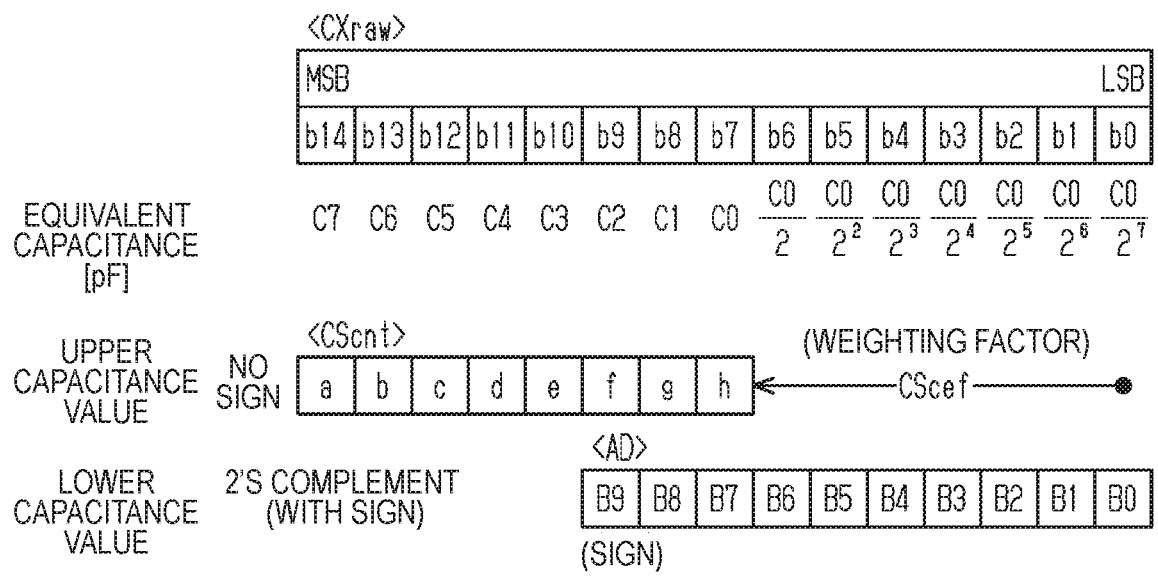
FIG. 7 is a diagram illustrating a relationship between an upper capacitor and a lower capacitor according to the embodiment.

Next, the control circuit 18 multiplies the reference capacitance control value CScnt by a capacitance weighting coefficient CScef to convert the minimum capacitance C0 of the capacitor array 11 into a value of $7^{th}$ power of 2 times the minimum unit of the detection capacitance Cx of the present embodiment (S16). This is because, in the present embodiment, the output of the AD conversion circuit 17 is 10 bits, and "8·C0" is represented by 10 bits by setting a gain of the differential amplifier circuit 16. That is, in the present embodiment, as illustrated in FIG. 7, b0 is set to a value of $\frac{1}{7}^{th}$ power of 2 of "C0", which is the minimum unit by the AD conversion circuit 17, and b1 is set to twice as large as b0. Accordingly, the lowermost bit of the reference capacitance control value CScnt corresponds to b7. Therefore, the lowermost bit of the reference capacitance control value CScnt is multiplied by the capacitance weighting coefficient CScef in order to obtain a value of $7^{th}$ power of 2 times the minimum unit of the AD conversion circuit 17.

Returning to FIG. 6, the control circuit 18 calculates a sensitivity ratio CSratio by dividing the reference capacitance control value CScnt by the standard capacitance value CStyp (S18). Then, the control circuit 18 substitutes "1" for the confirmation flag F (S20).

On the other hand, when the control circuit 18 determines that the confirmation flag F is "1" (S10: YES), the control circuit 18 turns on the first switch 13 and the third switch 15 and turns off the second switch 14, so that the discharge processing of the capacitor array 11 and the electrode 34 is executed (S22). Next, the control circuit 18 turns off the first switch 13 and the third switch 15 and turns on the second switch 14 to connect the capacitor array 11 and the electrode 34 in series to each other (S24). Then, the control circuit 18 acquires a differential voltage ΔV that is an output voltage of the differential amplifier circuit 16 (S26). Next, the control circuit 18 substitutes, into a lower capacitance value Cxf, a value obtained by multiplying the sensitivity ratio CSratio by the differential voltage ΔV (S28). This is processing of converting the differential voltage ΔV into a value when the combined capacitance Cs is the standard capacitance value CStyp. That is, as can be seen from Equation (9), the change amount of the intermediate potential Vout with respect to the change in the detection capacitance Cx changes according to the magnitude of the detection capacitance Cx.

Figure 8:
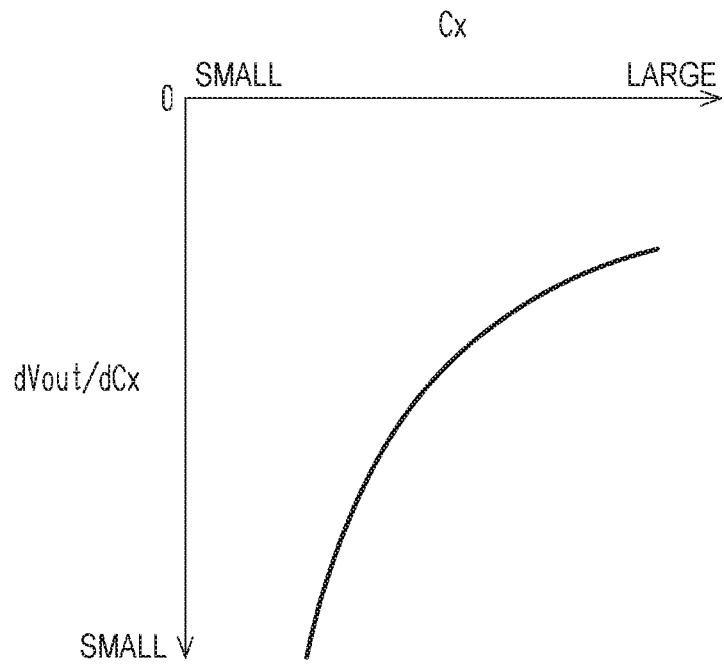
FIG. 8 is a diagram illustrating a ratio of the detection capacitance and a change in an intermediate potential with respect to a change in the detection capacitance according to the embodiment.

FIG. 8 illustrates a magnitude relationship between the detection capacitance Cx and the sensitivity, which is the change in the intermediate potential Vout with respect to the change in the detection capacitance Cx, based on Equation (9). The relationship illustrated in FIG. 8 is based on assumption that the combined capacitance Cs is equal to the detection capacitance Cx in Equation (9). This reflects a state at a time point when the processing of S12 is completed. That is, at a time point when the processing of S12 is completed, the combined capacitance Cs has a value as close as possible to the detection capacitance Cx. As illustrated in FIG. 8, the change amount of the intermediate potential Vout when the detection capacitance Cx changes from the time point when the processing of S12 is completed depends on the detection capacitance Cx at the time point when the processing of S12 is completed. This means that the change amount of the intermediate potential Vout when the detection capacitance Cx changes from the time point when the processing of S12 is completed depends on the combined capacitance Cs at the time point when the processing of S12 is completed. Therefore, it can be considered that after the processing of S12 is completed, the change in the differential voltage ΔV due to the change in the detection capacitance Cx by a predetermined amount depends on the combined capacitance Cs at the time point when the processing of S12 is completed.

Therefore, in the present embodiment, the differential voltage ΔV is multiplied by the sensitivity ratio CSratio in order to convert the differential voltage ΔV into a value when the combined capacitance Cs at the time point when the processing of S12 is completed is the standard capacitance value CStyp.

Then, the control circuit 18 substitutes the sum of an upper capacitance value Cxc and a lower capacitance value Cxf into the detection capacitance Cx(n) (S30). Here, the variable "n" indicates a current sampling value when the processing of FIG. 6 is repeatedly executed.

Next, the control circuit 18 determines whether or not a value obtained by subtracting the previously calculated detection capacitance Cx(n−1) from the currently calculated detection capacitance Cx(n) is equal to or larger than a predetermined amount ΔCth (S32). This processing is processing for determining whether or not a specific part of a person has approached the electrode 34. In view of the fact that the detection capacitance Cx increases when the specific part approaches the electrode 34, when the value increases beyond the predetermined amount ΔCth (S32: YES), the control circuit 18 determines that the specific part approaches, and substitutes "1" into a contact detection flag (S34). On the other hand, when the increase amount of the detection capacitance Cx is smaller than the predetermined amount ΔCth (S32: NO), the control circuit 18 substitutes "0" into the contact detection flag (S36). Then, the control circuit 18 outputs the value of the contact detection flag to the ECU via the communication line 50 (S38).

When the processing of S38 is completed, the control circuit 18 updates the variable n (S40).

When the processing of S20 and S40 are completed, the control circuit 18 terminates the series of processing illustrated in FIG. 6 once.

As described above, according to the present embodiment, the differential voltage ΔV is corrected by the sensitivity ratio CSratio, so that even when a difference between the detection capacitance Cx and the combined capacitance Cs is the same, a difference in the differential voltage ΔV can be compensated for by the combined capacitance Cs at a time point when the processing of S16 is completed. That is, according to Equation (9), the magnitude, that is, the absolute value, of the change amount of the intermediate potential Vout when the detection capacitance Cx changes is smaller when the combined capacitance Cs at a time point when the processing of S12 is completed is large than when the combined capacitance Cs is small. On the other hand, the sensitivity ratio CSratio is a parameter that is larger when the combined capacitance Cs is large than when the combined capacitance Cs is small. Therefore, even when the magnitude of the differential voltage ΔV is the same, the magnitude, that is, the absolute value, of the lower capacitance value Cxf is larger when the combined capacitance Cs is large than when the combined capacitance Cs is small. Therefore, a change in the change amount of the intermediate potential Vout when the detection capacitance Cx changes according to the magnitude of the combined capacitance Cs at a time point when the processing of S12 is completed can be suppressed. Furthermore, the detection capacitance Cx can be calculated with high accuracy.

According to the above-described embodiment, the following operation and effect can be further obtained.

(8) Whenever the switch 23 of the capacitor array 11 is manipulated, the parasitic capacitance of each wiring and the like may change. Therefore, whenever the detection capacitance Cx is updated, when the processing of S12 is performed prior to the update, even though the capacitance of the detection target is not actually changed, the detection capacitance Cx calculated by the processing of S30 may change due to the change in the parasitic capacitance. On the other hand, in the present embodiment, when the processing of S12 is completed, in a state in which the reference capacitance control value CScnt is fixed, the change in the detection capacitance Cx is monitored, so that erroneous detection of the change in the parasitic capacitance as a change in the capacitance of the detection target can be suppressed.

(9) In the binary search processing, processing of connecting the capacitor array 11 and the electrode 34 in series to each other after the discharge processing is executed again whenever each of the control values b0 to b7 is set as a manipulation amount is executed. Accordingly, even when a leakage current occurs in the detection capacitor 12, a difference between the upper capacitance value Cxc and the actual capacitance of the detection capacitor 12 can be minimized.

Third Embodiment

Hereinafter, a third embodiment will be described with reference to the drawings, focusing on differences from the first embodiment.

Figure 9:
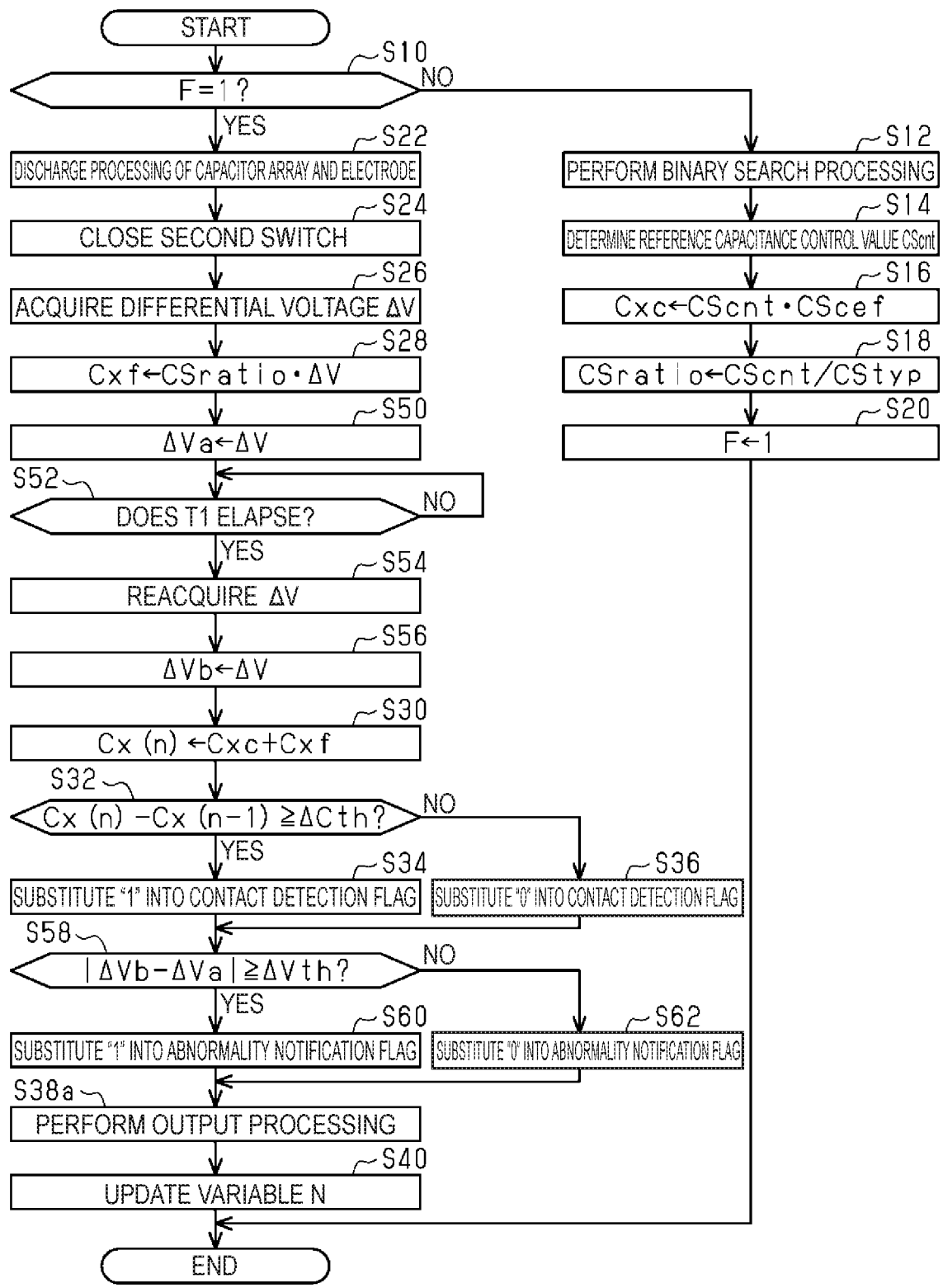
FIG. 9 is a flowchart illustrating a procedure of processing executed by the control circuit according to a third embodiment.

FIG. 9 illustrates a procedure of processing executed by the control circuit 18. The processing illustrated in FIG. 9 is repeatedly executed by the control circuit 18 at a predetermined cycle. In FIG. 9, the same step numbers are given to the processing corresponding to the processing illustrated in FIG. 6 for convenience.

In the series of processing illustrated in FIG. 9, when the processing of S28 is completed, the control circuit 18 substitutes the differential voltage ΔV acquired in the processing of S26 into a differential voltage ΔVa (S50). Then, the control circuit 18 waits until a predetermined time T1 elapses (S52: NO). Here, the predetermined time T1 is set to a time interval shorter than the repetition cycle of the processing of FIG. 9. Then, when the predetermined time T1 has elapsed (S52: YES), the control circuit 18 reacquires the differential voltage ΔV (S54), substitutes the reacquired differential voltage ΔV for the differential voltage ΔVb (S56), and proceeds to the processing of S30.

Further, after the processing of S34 and S36 is completed, the control circuit 18 determines whether or not an absolute value of a difference between the differential voltage ΔVa and the differential voltage ΔVb is larger than a specific amount ΔVth (S58). Here, the specific amount ΔVth is set according to a change speed of the detection capacitance Cx in a situation in which, for example, as the electrode 34 is in an electrically conductive state with the ground by a member having a low resistance value such as a conductor, an abnormal leakage current occurs, and thus the electrode 34 cannot function as a proximity detection sensor. The control circuit 18 substitutes "1" for an abnormality notification flag (S60) when it is determined that the value is larger than the specific amount ΔVth (S58: YES), and substitutes "0" for the abnormality notification flag (S62) when it is determined that the value is equal to or smaller than the specific amount ΔVth (S58: NO). Then, when the processing of S60 and S62 are completed, the control circuit 18 outputs the respective values of the contact detection flag and the abnormality notification flag to the ECU via the communication line 50 (S38a). Here, when the abnormality notification flag is "1", the ECU invalidates the value of the contact detection flag and executes notification processing or the like for notifying that there is abnormality to the outside.

When the processing of S38a is completed, the control circuit 18 executes processing of S40. When the processing of S20 and S40 is completed, the control circuit 18 once terminates a series of processing illustrated in FIG. 9.

Figure 10:
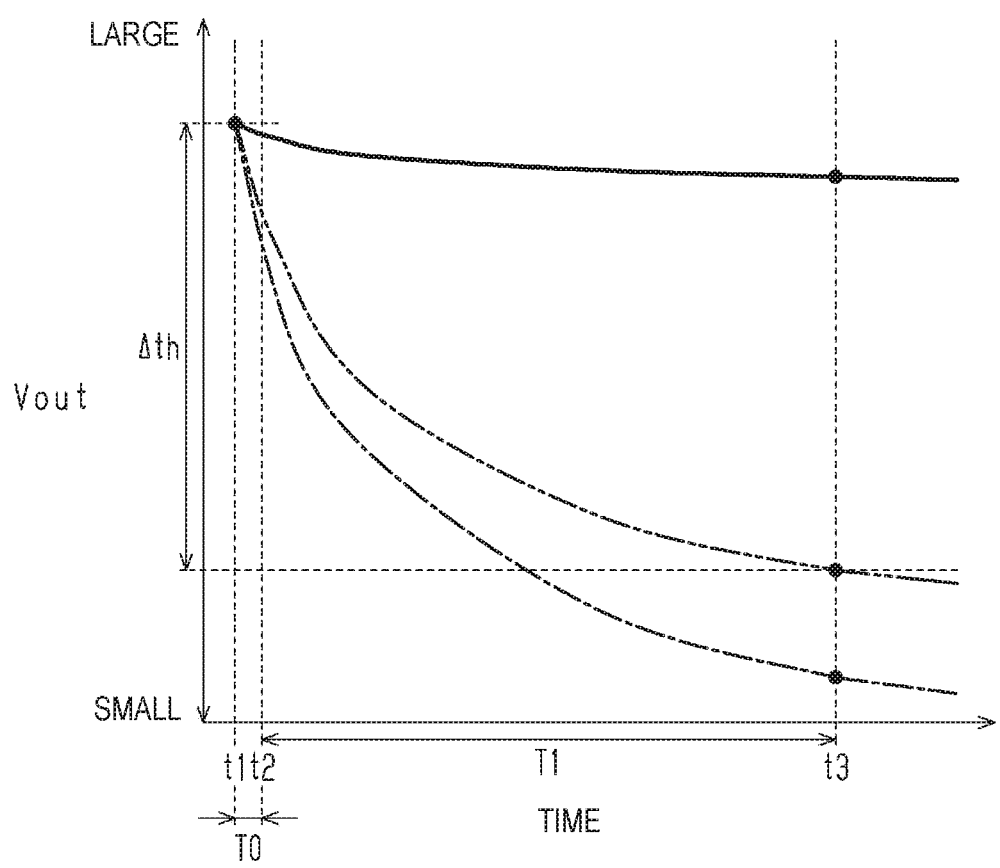
FIG. 10 is a time chart illustrating a transition example of the intermediate potential according to presence or absence of abnormality.

FIG. 10 illustrates transition of the intermediate potential Vout from the completion of the binary search processing. In detail, a solid line illustrates a transition example of the intermediate potential Vout in a normal state, and a dashed line illustrates a transition example of the intermediate potential Vout in an abnormal state. As illustrated in FIG. 10, a decrease amount of the intermediate potential Vout when the predetermined time T1 has elapsed increases when the abnormality occurs. Therefore, the control circuit 18 detects the decrease in the intermediate potential Vout in the abnormal state, based on the fact that the magnitude (absolute value) of the change speed of the differential voltage ΔV is large, by the processing of S58. Then, in this case, by notifying the ECU that there is the abnormality, the abnormality can be notified via the ECU when there is the abnormality. In view of the fact that the change in the intermediate potential Vout in the abnormal state may decrease or increase, the magnitude of the change speed of the differential voltage ΔV is monitored in the processing of S58.

Incidentally, FIG. 10 illustrates, by two-dot chain lines, that a decrease speed of the intermediate potential Vout is maximized while it is determined that a current state is normal, together with a time t1 when the processing of S24 is completed, a time t2 when the processing of S26 is executed, and a time t3 when the processing of S54 is executed. In the present embodiment, while it is determined that the current state is normal between the completion of the processing of S24 and the execution of the processing of S54, the decrease amount of the intermediate potential Vout when the decrease speed of the intermediate potential Vout is maximized is set as the specific amount ΔVth. Therefore, a time difference T0 between the time t2 when the processing of S26 is executed and the time t1 when the processing of S24 is completed is set as small as possible. However, if there is a limit in reducing the time difference T0, the specific amount ΔVth may be set with a margin according to the time difference T0. When the abnormality occurs due to a leakage current, a lowering speed of the intermediate potential Vout is larger as a time is closer to the completion of the processing of S24. Thus, it is preferable that the time difference T0 is as short as possible.

Correspondence

A correspondence between the subjects in the above embodiment and the subjects described as aspects of this disclosure is as follows. In the following, the correspondence is illustrated with reference to the aspects.

[First aspect, second aspect, eight aspect] A variable capacitance capacitor corresponds to the capacitor array 11. A voltage application device corresponds to the regulator 31. Manipulation processing corresponds to the processing of S1 in FIG. 4 and the processing of S12 in FIGS. 6 and 9. Detection processing corresponds to the processing of S2 to S4 in FIG. 4 and the processing of S26 to S30 in FIGS. 6 and 9. [Third aspect] The detection processing corresponds to the processing of FIG. 4. [Fourth aspect] The detection processing corresponds to the processing in FIGS. 6 and 9. [Fifth aspect] Output processing corresponds to the processing of S38 in FIG. 6 and the processing of S38a in FIG. 9 [Sixth aspect] A first discharge path corresponds to a path connected in parallel to the capacitor array 11 and including the first switch 13, and a first discharge switch corresponds to the first switch 13. A second discharge path corresponds to a path including the third switch 15, and a second discharge switch corresponds to the third switch 15. [Seventh aspect] A "sampling cycle of an output value of a differential amplifier circuit for outputting a signal indicating that a predetermined object approaches an electrode" corresponds to the cycle of the processing of FIG. 9, and a "sampling cycle shorter than the sampling cycle of the output value of the differential amplifier circuit for outputting the signal indicating that the predetermined object approaches the electrode" corresponds to the predetermined time T1.

The present embodiment can be modified and implemented as follows. The present embodiment and the following modifications can be implemented in combination with each other within a technically consistent range.

In the embodiment, the capacitances Cn (n=0 to 7) of the plurality of capacitors 22 of the capacitor array 11 may not be in a power-of-two relationship as indicated by Equation (1). For example, the capacitances Cn (n=0 to 7) may be in a relationship of a power of a natural number of 3 or more.

In the embodiment, the number of the capacitors 22 of the capacitor array 11 is predetermined as long as the capacitors 22 have different capacitances. Further, the capacitances of the plurality of capacitors 22 may be in a relationship of a power of a natural number of 2 or more, or may be in a relationship of increasing gradually with a certain deviation.

In the first embodiment, the AD conversion circuit 17 may be omitted, and the capacitance of the detection capacitor 12 may be detected by analog processing. In the first embodiment, the differential amplifier circuit 16 may be omitted, and the differential voltage ΔV may be AD-converted by the AD conversion circuit 17 as it is.

In the first embodiment, an amplifier for amplifying the intermediate potential Vout may be employed instead of the differential amplifier circuit 16. Alternatively, the differential amplifier circuit 16 may be omitted, and the intermediate potential Vout may be AD-converted by the AD conversion circuit 17 as it is. That is, the control circuit 18 as the detection unit 18a may detect the intermediate potential Vout as it is.

In the first embodiment, the first combined capacitance Cs1 and the second combined capacitance Cs2 are any one of the combined capacitances Cs in the vicinity where the magnitude relationship between the intermediate potential Vout and the reference potential Vref is inverted.

In the above embodiment, the low-side potential V2 may not be the same potential (=0) as the ground. In this case, for example, in Equation (4), V1 may be changed to "V1−V2".

In the embodiment, the reference potential Vref, which is an adjustment target value of the potential of the capacitive voltage division of the power supply, is not limited to "V1/2", and may be changed to, for example, "V1/3" in a predetermined manner. Even when the reference potential Vref is changed in a predetermined manner, the estimated combined capacitance Cse, at which the potential of the capacitive voltage division of the power supply by the combined capacitance Cs and the detection capacitor 12, that is, the intermediate potential Vout, coincides with the reference potential Vref, is calculated, so that the detection capacitance Cx can be derived.

In the above embodiment, the reference potential Vref may be set by DAC-capacitive voltage division or the like in addition to resistance voltage division.

In the first embodiment, a plurality of the detection capacitors 12 whose capacitances are to be detected may be provided. In a case where the detection capacitances Cx of the plurality of detection capacitors 12 are individually derived, a switch may be provided which is selectively connected to the capacitor array 11 or the like that is another circuit configuration, for example, in a time-division manner. Such individual derivation of the detection capacitances Cx of the plurality of detection capacitors 12 can be realized by shortening a time required for deriving the detection capacitances Cx of the respective detection capacitors 12.

In the binary search processing (S12) in FIGS. 6 and 9, it is not essential to execute the discharge processing every time before determining the respective determined values of the control values b7 to b0. In other words, the processing may be equivalent to 1 to 7 in the first embodiment.

In the processing of FIGS. 6 and 9, the sensitivity ratio CSratio is a value obtained by dividing the reference capacitance control value CScnt by the standard capacitance value CStyp. However, the present invention is not limited thereto. For example, a value obtained by dividing the upper capacitance value Cxc by the standard capacitance value CStyp may be used.

The conversion processing for converting the differential voltage ΔV into a value when the combined capacitance Cs is a predetermined value such as the standard capacitance value CSType is not limited to the processing of S28. For example, processing of multiplying the differential voltage ΔV by the reference capacitance control value CScnt may be used. In order to make the magnitude of the detection capacitance Cx equal to that of the second embodiment or the third embodiment even while performing such processing, a gain "R2/R1" of the differential amplifier circuit 16 may be set to "1/CStyp" of the value exemplified in the second embodiment.

In the configuration illustrated in FIG. 5, the detection capacitance Cx may be calculated by the processing illustrated in the first embodiment. At this time, processing of determining whether or not the abnormality exists, based on the change amount of the differential voltage ΔV when the predetermined time T1 elapses may be added.

In the configuration illustrated in FIG. 5, the control circuit 18 includes a CPU and a ROM, and the CPU executes a program stored in the ROM, so that the processing illustrated in FIGS. 6 and 9 may be realized.

In the configuration illustrated in FIG. 5, the filter circuit may be omitted.

The providing of the regulator 31 in the configuration of FIG. 5 is not essential.

In the processing of S32, instead of determining whether or not the value obtained by subtracting the previous detection capacitance Cx(n−1) from the current detection capacitance Cx(n) is equal to or larger than the predetermined amount ΔCth, whether or not the absolute value of the value obtained by subtracting the previous detection capacitance Cx(n−1) from the current detection capacitance Cx(n) is equal to or larger than the predetermined amount ΔCth may be determined.

In the processing of FIG. 9, after the processing of S56, the detection capacitance Cx is recalculated based on the differential voltage ΔVb, and in the processing of S58, whether or not the absolute value of the value obtained by subtracting the detection capacitance Cx(n) from the recalculated detection capacitance Cx is equal to or larger than the specific amount ΔCth1. Accordingly, whether or not the abnormality exists is determined based on the fact that the magnitude of the change amount of the differential voltage ΔV is greater than the specific amount.

In the embodiment, a comparator to which the intermediate potential Vout and the reference potential Vref are input to determine the magnitude relationship therebetween may be provided between the connection point N1 and the control circuit 18. Then, in the binary search, the magnitude relationship between the intermediate potential Vout and the reference potential Vref, that is, the magnitude relationship between the combined capacitance Cs and the detection capacitance Cx, may be determined by the comparator instead of the differential amplifier circuit 16 or the like. Even in this case, the control circuit 18 can determine the set value "abcd_efgh" of the capacitor array 11, based on the determination result by the comparator.

Instead of the differential amplifier circuit 16, the comparator for comparing the magnitudes of the intermediate potential Vout and the reference potential Vref may be provided. Even in this case, since the set value "abcd_efgh" of the capacitor array 11 can be determined, the detection capacitance Cx can be detected while the combined capacitance Cs of the capacitor array 11 is considered as being equal to the detection capacitance Cx.

The processing for detecting the detection capacitance Cx based on the combined capacitance Cs when the intermediate potential Vout has two values sandwiching the reference potential Vref and each of the differences between the intermediate potential Vout and the reference potential Vref is the minimum is not limited to processing of calculating the detection capacitance Cx by linear interpolation based on the differential voltages ΔV1 and ΔV2 as exemplified in the first embodiment. For example, a medium value of the two values may be considered as the detection capacitance Cx. This processing can also be realized by providing the comparator for comparing the magnitudes of the intermediate potential Vout and the reference potential Vref, instead of the differential amplifier circuit 16.

The technical idea that can be grasped from the embodiments and the modifications will be described.

A first aspect is directed to a capacitance detection device including: a variable capacitance capacitor; an electrode constituting a detection target whose capacitance is to be detected; and a control circuit, in which the control circuit executes: manipulation processing of manipulating a capacitance of the variable capacitance capacitor to control an intermediate potential, which is a potential at a connection point between the variable capacitance capacitor and the electrode, to a reference potential, when a voltage of a voltage application device is applied to the electrode via the variable capacitance capacitor; and detection processing of detecting the capacitance of the detection target, based on the capacitance of the variable capacitance capacitor when being controlled to the reference potential.

In the above configuration, by controlling the intermediate potential to the reference potential, a ratio between the capacitance of the detection target and the capacitance of the variable capacitance capacitor can be controlled to a ratio according to the reference potential. Therefore, the capacitance of the detection target or a value close thereto can be grasped from the capacitance of the variable capacitance capacitor and the ratio as the manipulation amount when being controlled to the reference potential. Therefore, according to the detection processing, the capacitance of the detection target can be detected. Moreover, in general, the manipulation processing of controlling the intermediate potential to the reference potential by manipulating the capacitance of the variable capacitance capacitor can be performed without setting the number of times of switching manipulations to the order of tens of thousands. Therefore, in the configuration, the time required for detecting the capacitance of the detection target can be shortened as compared with the above-described case where the capacitance is detected by deriving the count value.

A second aspect is directed to the capacitance detection device according to the first aspect, further including a differential amplifier circuit that receives input of the intermediate potential and the reference potential, and outputs a voltage signal according to a difference between the intermediate potential and the reference potential, in which the detection processing is processing of detecting the capacitance of the detection target, based on an output value of the differential amplifier circuit when being controlled to the reference potential, in addition to the capacitance of the variable capacitance capacitor when being controlled to the reference potential.

When the intermediate potential is controlled to the reference potential, a deviation between the intermediate potential and the reference potential may occur depending on a changeable minimum unit of the capacitance of the variable capacitance capacitor. Therefore, when the capacitance of the detection target is detected based on only two values including the capacitance of the variable capacitance capacitor determined from the reference potential and a ratio between the capacitance of the variable capacitance capacitor and the capacitance of the detection target, the resolution of the capacitance of the detection target depends on the changeable minimum unit of the capacitance of the variable capacitance capacitor. Therefore, in the configuration, as the capacitance of the detection target is detected additionally considering the output value of the differential amplifier circuit, the capacitance of the detection target can be specified in a minute level, in which the capacitance cannot be grasped from only the two values including the capacitance of the variable capacitance capacitor and the ratio, according to a deviation amount between the reference potential and the intermediate potential.

A third aspect is directed to the capacitance detection device according to the first or second aspect, in which the detection processing is processing of detecting the capacitance of the detection target, based on two values of the capacitance of the variable capacitance capacitor when the intermediate potential has a pair of values sandwiching the reference potential and each of differences between the intermediate potentials and the reference potential is the minimum.

In the configuration, two capacitance values sandwiching the actual capacitance of the detection target are determined based on the two values of the capacitance of the variable capacitance capacitor and the ratio between the capacitance of the variable capacitance capacitor grasped from the reference potential and the capacitance of the detection target. In other words, the capacitance of the detection target is equal to or larger than the smaller one of the two capacitance values and is smaller than the larger one thereof. Therefore, according to the configuration, the capacitance of the detection target can be narrowed down.

A fourth aspect is directed to the capacitance detection device according to the second aspect, in which the detection processing is processing of detecting the capacitance of the detection target by correcting, based on the output value of the differential amplifier circuit, an upper capacitance value that is the capacitance of the detection target grasped according to the capacitance of the variable capacitance capacitor and the reference potential when being controlled to the reference potential, and causing a magnitude of a correction amount based on the output value to be larger when the capacitance of the variable capacitance capacitor when being controlled to the reference potential is large than when the capacitance is small, even if the output value of the differential amplifier circuit is the same.

A magnitude of the difference between the intermediate potential and the reference potential in a step in which the difference between the intermediate potential and the reference potential is controlled to a minimum is considered to be inversely proportional to the capacitance of the variable capacitance capacitor at that time. Therefore, even when the difference between the intermediate potential and the reference potential is the same, the magnitude of the difference between an actual capacitance of the detection target and the capacitance of the detection target that can be grasped from only the capacitance of the variable capacitance capacitor and the reference potential changes depending on the capacitance of the variable capacitance capacitor. That is, even when the magnitude of the difference between the intermediate potential and the reference potential is the same, the difference between the actual capacitance of the detection target and the capacitance of the detection target that can be grasped from only two values including the capacitance of the variable capacitance capacitor and the reference potential is larger when the capacitance of the variable capacitance capacitor is large than when the capacitance of the variable capacitance capacitor is small. Therefore, in the configuration, as a magnitude of a correction amount is larger when the capacitance of the variable capacitance capacitor is large than when the capacitance of the variable capacitance capacitor is small, a detection error of the capacitance of the detection target, caused by the magnitude of the capacitance of the variable capacitance capacitor, can be suppressed.

A fifth aspect is directed to the capacitance detection device according to any one of the second to fourth aspects, in which the control circuit executes: the detection processing repeatedly; and output processing of, when the capacitance of the detection target detected by the detection processing changes, outputting a signal indicating the change.

In the configuration, when the capacitance of the detection target is changed, the change can be notified to the outside.

A sixth aspect is directed to the capacitance detection device according to the fifth aspect, further including: a first discharge path that discharges the variable capacitance capacitor; a first discharge switch that opens and closes the first discharge path; a second discharge path that discharges the electrode; and a second discharge switch that opens and closes the second discharge path, in which the control circuit executes: discharge processing of discharging the variable capacitance capacitor and the electrode while closing the first discharge switch and the second discharge switch, the detection processing when the first discharge switch and the second discharge switch are opened after the discharge processing, and the voltage application device applies the voltage to the electrode via the variable capacitance capacitor, and the detection processing repeatedly in a state in which the capacitance of the variable capacitance capacitor is fixed after the intermediate potential is controlled to the reference potential.

Whenever the capacitance of the variable capacitance capacitor is manipulated by the manipulation processing, the parasitic capacitance of each wiring may change. Therefore, whenever the detection processing is executed, when the manipulation processing is executed prior to the detection processing, even though the capacitance of the detection target is not actually changed, the capacitance detected by the detection processing may change due to a change in the parasitic capacitance. Therefore, in the configuration, the detection processing is repeatedly executed in a state in which the capacitance of the variable capacitance capacitor is fixed after the intermediate potential is controlled to the reference potential, so that the change in the parasitic capacitance caused by manipulation of the capacitance of the variable capacitance capacitor can be prevented from being erroneously detected as a change in the capacitance of the detection target.

A seventh aspect is directed to the capacitance detection device according to the sixth aspect, further including a differential amplifier circuit that receives input of the intermediate potential and the reference potential, and outputs a voltage signal according to a difference between the intermediate potential and the reference potential, in which the output processing includes processing of outputting a signal indicating that the capacitance detection device is abnormal, when a magnitude of a change amount of the output value of the differential amplifier circuit is larger than a specific amount, in a sampling cycle shorter than a sampling cycle of the output value of the differential amplifier circuit for outputting a signal indicating that a predetermined object approaches the electrode.

For example, when the electrode is in a conductive state with a certain resistance value with respect to the ground, an abnormal leak current occurs, and the magnitude of the change amount of the output value of the differential amplifier circuit in an extremely short sampling cycle is increased. On the other hand, when there is no leakage current, the magnitude of the change amount of the output value of the differential amplifier circuit in an extremely short sampling cycle has an extremely small amount of influence on noise. Therefore, in the configuration, when the magnitude of the change amount of the output value of the differential amplifier circuit in a sampling cycle shorter than the sampling cycle of the output value of the differential amplifier circuit is larger than a specific amount, a signal indicating that there is abnormality is output, so that the abnormality can be notified to the outside.

An eighth aspect is directed to the capacitance detection device according to any one of the first to seventh aspects, in which the variable capacitance capacitor is a component formed by connecting a plurality of series connection bodies, each having a capacitor and a switch connected in series, in parallel to each other, and has the capacitance that varies by turning on and off the switch, and the capacitances of the capacitors in the plurality of series connection bodies are different from each other.

The present invention has the effect of further shortening the time required for detection without lowering the detection accuracy.

A capacitance detection device includes: a capacitor array that has a plurality of capacitors having different capacitances and connected in parallel to each other and has a combined capacitance changed by selectively switching the plurality of capacitors between an ON state and an OFF state; a detection capacitor connected in series to the capacitor array; a switching control unit that selectively switches the plurality of capacitors between the ON state and the OFF state; a detection unit that detects an intermediate potential, which is a potential of capacitive voltage division of a power supply, based on the combined capacitance and the capacitance of the detection capacitor; an acquisition unit that acquires, as a first combined capacitance and a second combined capacitance, any one of the combined capacitances in a vicinity where a magnitude relationship between the intermediate potential and a predetermined reference potential is inverted; a calculation unit that calculates an estimated combined capacitance of the capacitor array when the intermediate potential coincides with the reference potential, based on a first intermediate potential and a second intermediate potential that are the intermediate potentials when the combined capacitance is the first combined capacitance and the second combined capacitance, respectively; and a derivation unit that derives the capacitance of the detection capacitor as a detection capacitance, based on the estimated combined capacitance.

According to this configuration, the acquisition unit acquires the first combined capacitance and the second combined capacitance near the capacitance of the capacitor array when the intermediate potential coincides with the reference potential. Then, the calculation unit calculates the estimated combined capacitance based on the first intermediate potential and the second intermediate potential. The derivation unit derives the detection capacitance based on the fact that the intermediate potential, which is a potential of capacitive voltage division of the power supply by the estimated combined capacitance and the capacitance of the detection capacitor, coincides with the reference potential.

The combined capacitance can be promptly converged to the first combined capacitance and the second combined capacitance by selectively switching the plurality of capacitors between the ON state and the OFF state by the switching control unit. Therefore, the time required for detecting the capacitance of the detection capacitor can be further shortened. In addition, the detection capacitance is derived such that the intermediate potential, which is the potential of the capacitive voltage division of the power supply with the estimated combined capacitance, coincides with the reference potential. Thus, the capacitance of the detection capacitor can be detected with higher accuracy than the resolution of the capacitance of the capacitor array.

In the capacitance detection device, it is preferable that the detection unit detects a differential voltage between the intermediate potential and the reference potential.

According to this configuration, since the detection unit only needs to detect the differential voltage between the intermediate potential and the reference potential, a range required for the detection can be further reduced as compared to, for example, the entire range of the intermediate potential.

It is preferable that the capacitance detection device further includes an amplification unit that amplifies the differential voltage between the intermediate potential and the reference potential.

According to this configuration, the amplification unit amplifies the differential voltage between the intermediate potential and the reference potential, so that for example, even when the differential voltage is minute, the differential voltage can be made more prominent.

It is preferable that the capacitance detection device further includes an AD conversion unit for AD-converting the differential voltage between the intermediate potential and the reference potential.

According to this configuration, the differential voltage between the intermediate potential and the reference potential can be handled as a digital value, so that smoother arithmetic processing can be realized.

(A) In the capacitance detection device, the capacitances of the plurality of capacitors may have a power-of-two relationship.

According to this configuration, the first combined capacitance and the second combined capacitance can be acquired in the shortest time by the binary search.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A capacitance detection device comprising:
a capacitor array constituting a variable capacitance capacitor, the capacitor array comprising a plurality of capacitors of different capacitances which are connected in parallel to each other, the capacitor array having a combined capacitance;
a detection capacitor whose capacitance is to be detected, said detection capacitor being connected in series to the capacitor array; and
a control circuit configured to:
detect an intermediate potential, which is a potential of capacitive voltage division of a power supply, based on the combined capacitance and a capacitance of the detection capacitor,
selectively switch the plurality of capacitors between an ON state and an OFF state to change the combined capacitance of the capacitor array while the intermediate potential is being detected,
acquire, as a first combined capacitance and a second combined capacitance, any one of a plurality of the combined capacitance in a vicinity where a magnitude relationship between the intermediate potential and a reference potential is inverted,
calculate an estimated combined capacitance of the capacitor array when the intermediate potential coincides with the reference potential based on a first intermediate potential and a second intermediate potential that are intermediate potentials when the combined capacitance is the first combined capacitance and the second combined capacitance, respectively, and
derive the capacitance of the detection capacitor as a detection capacitance based on the estimated combined capacitance.

2. The capacitance detection device according to claim 1, further comprising:
a differential amplifier circuit configured to receive an input of the intermediate potential and the reference potential, and to output a voltage signal according to a difference between the intermediate potential and the reference potential, wherein
the detection of the capacitance of the detection capacitor is based on an output value of the differential amplifier circuit when being controlled to the reference potential, in addition to a capacitance of the variable capacitance capacitor when being controlled to the reference potential.

3. The capacitance detection device according to claim 2, wherein the detection of the capacitance of the detection capacitor is performed by correcting, based on the output value of the differential amplifier circuit, an upper capacitance value that is the capacitance of the detection capacitor determined according to the capacitance of the variable capacitance capacitor and the reference potential when being controlled to the reference potential, and causing a magnitude of a correction amount based on the output value to be larger when the capacitance of the variable capacitance capacitor when being controlled to the reference potential is large than when the capacitance is small, even if the output value of the differential amplifier circuit is the same.

4. The capacitance detection device according to claim 2, wherein the control circuit is configured to:
perform the detection repeatedly; and
when the capacitance of the detection capacitor detected by the detection changes, output a signal indicating the change.

5. The capacitance detection device according to claim 4, further comprising:
a first discharge path configured to discharge the variable capacitance capacitor;
a first discharge switch configured to open and close the first discharge path;
a second discharge path configured to discharge the detection capacitor; and
a second discharge switch configured to open and close the second discharge path, wherein the control circuit is configured to:
discharge the variable capacitance capacitor and the detection capacitor while closing the first discharge switch and the second discharge switch;
perform the detection when the first discharge switch and the second discharge switch are opened after the discharge, and a voltage application device applies a voltage to the detection capacitor via the variable capacitance capacitor; and
perform the detection repeatedly in a state in which the capacitance of the variable capacitance capacitor is fixed after the intermediate potential is controlled to the reference potential.

6. The capacitance detection device according to claim 5, wherein the outputting includes outputting a signal indicating that the capacitance detection device is abnormal, when a magnitude of a change amount of the output value of the differential amplifier circuit is larger than a specific amount in a sampling cycle shorter than a sampling cycle of the output value of the differential amplifier circuit for outputting a signal indicating that a predetermined object approaches the detection capacitor.

7. The capacitance detection device according to claim 1, wherein the detection of the capacitance of the detection capacitor is based on two values of the capacitance of the variable capacitance capacitor when the intermediate potential has a pair of values sandwiching the reference potential and each of differences between the intermediate potentials and the reference potential is a minimum.

8. The capacitance detection device according to claim 1, wherein the variable capacitance capacitor is a component formed by connecting a plurality of series connection bodies, each having one of the plurality of capacitors and a switch connected in series, in parallel to each other, and has a capacitance that varies by turning on and off the switches.

9. The capacitance detection device according to claim 1, wherein the control circuit is configured to:
detect a differential voltage between the intermediate potential and the reference potential, and
calculate the estimated combined capacitance of the capacitor array based on a first differential voltage correlated with the first intermediate potential and a second differential voltage correlated with the second intermediate potential.

* * * * *